US009705448B2

(12) United States Patent
Ganley

(10) Patent No.: US 9,705,448 B2
(45) Date of Patent: Jul. 11, 2017

(54) DUAL-USE SOLAR ENERGY CONVERSION SYSTEM

(71) Applicant: James T. Ganley, St. Paul, MO (US)

(72) Inventor: James T. Ganley, St. Paul, MO (US)

(73) Assignee: James T. Ganley, St. Paul, MO (US)

( * ) Notice: Subject to any disclaimer, the term of this patent is extended or adjusted under 35 U.S.C. 154(b) by 59 days.

(21) Appl. No.: 14/823,768

(22) Filed: Aug. 11, 2015

(65) Prior Publication Data

US 2017/0047465 A1    Feb. 16, 2017

(51) Int. Cl.

| | |
|---|---|
| H02S 40/22 | (2014.01) |
| H02S 40/42 | (2014.01) |
| H02S 40/44 | (2014.01) |
| H02S 20/32 | (2014.01) |
| H01L 31/0525 | (2014.01) |
| H01L 31/054 | (2014.01) |

(52) U.S. Cl.
CPC .......... H02S 40/22 (2014.12); H01L 31/0547 (2014.12); H02S 20/32 (2014.12); H02S 40/425 (2014.12); H02S 40/44 (2014.12); H01L 31/0525 (2013.01); H01L 31/0543 (2014.12)

(58) Field of Classification Search
CPC .......... H02S 40/22; H02S 40/40; H02S 40/42; H02S 40/425; H02S 40/44; H02S 20/32; F24J 2/06–2/18
See application file for complete search history.

(56) References Cited

U.S. PATENT DOCUMENTS

| | | | | |
|---|---|---|---|---|
| 3,872,634 A | * | 3/1975 | Seaman | E04H 15/18 52/222 |
| 4,109,638 A | * | 8/1978 | Matlock | F24J 2/14 126/573 |
| 4,256,088 A | * | 3/1981 | Vindum | F24J 2/10 126/571 |
| 4,278,829 A | * | 7/1981 | Powell | F24J 2/07 126/634 |
| 4,356,812 A | * | 11/1982 | Haven | F24J 2/10 126/572 |
| 4,561,423 A | * | 12/1985 | Blasey | F24J 2/07 126/602 |

(Continued)

FOREIGN PATENT DOCUMENTS

| | | | | |
|---|---|---|---|---|
| FR | WO 2014091172 A2 | * | 6/2014 | F24J 2/14 |
| WO | WO 2012027418 A1 | * | 3/2012 | F24J 2/525 |

OTHER PUBLICATIONS

Rabl, "Comparison of solar concentrators." Solar Energy, 18.2 (1976): 93-111.*

(Continued)

Primary Examiner — Allison Bourke
Assistant Examiner — William E McClain

(57) ABSTRACT

A dual-use solar energy conversion system has an innovative structural framework which accurately maintains the relative position and alignment of functional system components. The system has parabolic trough reflectors which focus solar radiation onto arrays of solar cells. The cells convert a portion of the incident radiation into electrical energy and the rest is collected in a cooling fluid and subsequently discharged as low-grade thermal energy to an energy storage medium. During operation, the entire system rotates about a vertical axis to track the azimuthal position of the sun.

17 Claims, 5 Drawing Sheets

(56) References Cited

U.S. PATENT DOCUMENTS

| | | | | |
|---|---|---|---|---|
| 4,771,764 A | * | 9/1988 | Cluff | F24J 2/08 126/577 |
| 6,498,290 B1 | * | 12/2002 | Lawheed | F24J 2/085 126/600 |
| 2001/0036024 A1 | * | 11/2001 | Wood | F24J 2/10 359/853 |
| 2005/0092360 A1 | * | 5/2005 | Clark | F24J 2/06 136/259 |
| 2007/0227574 A1 | * | 10/2007 | Cart | H01L 31/0547 136/206 |
| 2008/0313825 A1 | * | 12/2008 | Murakoshi | E01D 11/00 14/19 |
| 2009/0032089 A1 | * | 2/2009 | Chen | F24J 2/542 136/251 |
| 2009/0056698 A1 | | 3/2009 | Johnson et al. | |
| 2009/0314325 A1 | | 12/2009 | Borton | |
| 2010/0043779 A1 | * | 2/2010 | Ingram | F24J 2/07 126/694 |
| 2010/0101560 A1 | * | 4/2010 | Olsson | F24J 2/16 126/601 |
| 2010/0163014 A1 | * | 7/2010 | Johnson | F24J 2/14 126/573 |
| 2010/0206356 A1 | * | 8/2010 | Cheung | F24J 2/14 136/246 |
| 2010/0218817 A1 | * | 9/2010 | Guha | F24J 2/067 136/256 |
| 2010/0263709 A1 | | 10/2010 | Norman et al. | |
| 2010/0307566 A1 | * | 12/2010 | Hinderling | F24J 2/5269 136/246 |
| 2010/0319684 A1 | | 12/2010 | Almogy et al. | |
| 2011/0041894 A1 | * | 2/2011 | Liao | F24J 2/14 136/246 |
| 2011/0176256 A1 | * | 7/2011 | Van Straten | F03D 1/005 361/601 |
| 2011/0247679 A1 | | 10/2011 | Shelef et al. | |
| 2011/0253214 A1 | * | 10/2011 | Chung | F24J 2/542 136/259 |
| 2011/0259396 A1 | * | 10/2011 | Hoffman | H01L 31/0543 136/246 |
| 2012/0085340 A1 | * | 4/2012 | Hinderling | F24J 2/32 126/573 |
| 2012/0097216 A1 | * | 4/2012 | Lin | F24J 2/06 136/248 |
| 2012/0132258 A1 | * | 5/2012 | Albanese | F24J 2/1057 136/248 |
| 2013/0112237 A1 | * | 5/2013 | Almogy | F24J 2/38 136/246 |
| 2014/0102510 A1 | | 4/2014 | Kalus et al. | |
| 2015/0308717 A1 | * | 10/2015 | Rochier | F24J 2/14 126/600 |

OTHER PUBLICATIONS

Blaine R. Copenheaver; PCT International Search Report; Aug. 29, 2016; Total 9 Pages.

* cited by examiner

DUAL-USE SOLAR ENERGY CONVERSION SYSTEM

BACKGROUND OF THE INVENTION

This invention relates generally to a solar energy conversion system with parabolic trough reflectors and arrays of solar cells; more specifically, the invention relates to a system with an innovative structural framework which maintains the position and alignment of the parabolic trough reflectors relative to the solar cell arrays as the entire system rotates about a vertical axis to track the sun.

Solar cells are photovoltaic devices which convert sunlight directly into electrical energy. The past few decades have seen significant increases in solar cell efficiency and dramatic decreases in the cost of some types of cells. However, in spite of cost reductions and efficiency improvements, it is often the case that electricity generated by solar cells is provided to customers at real (unsubsidized) costs that are greater than the cost of electricity generated by conventional means.

Three major problems prevent solar-cell-based systems from more effectively penetrating the energy marketplace. First, even though the cost of solar cells has decreased, the cells still represent a major cost driver for installations that use them. Second, even though the efficiencies of some types of solar cells have increased, at least 75 to 80% of the solar energy incident on the most commonly used cells is not converted to useful energy. Third, most solar-cell-based installations are individually specialized designs for homes, businesses, airports, etc. This latter situation leads to site-specific design costs and high per-kilowatt installation and maintenance costs.

The objective of this invention is to provide a practical solar energy conversion system which successfully addresses the three problems mentioned above. This invention accomplishes its objective by offering a system incorporating important extensions and improvements of previously-revealed concentrated solar power (CSP) technology.

Regarding the problem of solar cells as a major cost driver for solar-cell-based systems, it is well known that parabolic trough reflectors can be used to collect solar energy from a large area and focus it onto a much smaller area, with energy concentration ratios (ratio of trough reflector width to solar image width) in the range from 20 to 50 easily achieved. When used in a solar-cell-based energy conversion system, parabolic trough reflectors can decrease—by a factor on the order of 20 to 50 or even more—the area, and thus the cost, of the solar cells required to generate a given amount of electrical power. In addition, technology advances related to back-contact silicon solar cells (U.S. Pat. Nos. 7,339,110 and 8,889,462) now offer the potential for high solar-to-electrical conversion efficiencies even for cells exposed to energy concentration ratios greater than 50. However, the use of parabolic trough reflectors in conjunction with solar cell arrays creates the need for active cooling of the cells and it presents very demanding orientation and alignment requirements for system components.

The present invention discloses a novel structural framework which interconnects a multiplicity of parabolic trough reflectors with corresponding arrays of solar cells and associated cooling apparatus. The framework accurately maintains the position and alignment of the reflectors relative to the solar cell arrays and the cooling apparatus as the entire system rotates to track the sun, thus providing a practicable solar energy conversion system with greatly reduced solar cell cost. In this way, the present invention addresses the first problem mentioned above.

Regarding the problem of low overall energy utilization in solar energy conversion systems, the system disclosed herein converts a portion of incident solar radiation directly to electricity. It also collects and stores the unconverted portion of the incident energy—that portion which would normally be discarded as waste heat—so that it can be used as needed in low-temperature applications.

In the present system, parabolic trough reflectors focus solar radiation onto solar cells positioned in or near the focal planes of the reflectors. Because of the high radiant flux produced near the focal planes, the irradiated cells must be actively cooled to prevent them from reaching temperatures which would significantly reduce their efficiency and their lifetime. The amount of thermal energy which must be removed from the cells is quite large, being at least three to four times the quantity of electrical energy generated by the cells. The energy conversion system disclosed herein provides a practical, efficient method for cooling the irradiated cells and for storing the waste heat. The cooling apparatus, which is an integral part of the aforementioned structural framework, removes low-grade waste heat (sensible fluid temperatures less than roughly 60° C.) from the solar cells and collects it in a cooling fluid. The system causes the cooling fluid to pass through, and discharge thermal energy to, a storage medium, which could be underground layers of gravel or rock. Energy transfer from the system to the storage medium can be direct, or it can be indirect, as through an intermediate heat exchanger. In either case, the accumulated thermal energy may be reclaimed from the storage medium as needed—after days, weeks, or even months of storage—for use locally in applications such as space heating and hot water heating for homes and businesses, or as process heat for industrial or agricultural operations. (The process of storing low-grade thermal energy for long periods of time is referred to as Seasonal Thermal Energy Storage (STES). STES technology has been proven to be commercially viable even in cold climates and at high latitudes, e.g. Drake Landing Solar Community in Alberta, Canada and Braedstrup Fjernvarm in Braedstrup, Denmark.) The low-grade thermal energy collected and stored by the present system has high value because it can replace the fossil fuels that are normally burned in low-temperature applications. It is also worth noting that roughly 20% of the electrical energy generated in industrially developed countries is used for space heating, hot water heating, and low-grade process heat. The thermal energy collected and stored by the presently disclosed system can therefore be used directly to replace a significant fraction of the electrical energy now generated in developed countries by conventional methods.

The system described herein is thus seen to be a dual-use system, generating both electricity and valuable low-grade thermal energy which can be stored for long periods of time. The system makes use of the complete spectrum of solar wavelengths, even those wavelengths which are energetically incapable of producing electrical current within a solar cell. The present invention addresses the second problem mentioned above by providing a practical solar energy conversion system with substantial energy utilization improvements over previously revealed systems.

Regarding the problem of size and site specificity of solar energy conversion systems relative to the size and location of their intended energy markets, this invention offers improvements and extensions of existing art as it pertains to CSP systems that use trough reflectors.

Existing CSP art includes two different types of trough reflector systems. The first type, used in most currently operating CSP systems, uses trough reflectors that are permanently oriented in either a North/South direction or an East/West direction. For these systems, each reflector rotates, or tilts, about its focal line in order to track the sun. Energy conversion systems of this type will be referred to herein as Tilting Trough Reflector (TTR) systems. TTR systems have three serious drawbacks. The first drawback is that, since each row of trough reflectors tilts in order to accomplish sun tracking, the reflector rows must be separated in order to avoid mutual shadowing at low sun angles. This leads to poor land area utilization, which in many currently operating TTR systems is less than 30%. Poor land area utilization means that these systems must be located in areas where average daily insolation is high and land costs are low. Such locations are usually far from the population and industrial centers that use the energy. The second drawback for TTR systems is that each row of reflectors requires its own individual drive and control mechanisms in order to track the sun. This adds considerable complexity to the overall system—complexity which increases installation and maintenance costs and decreases system reliability. The third drawback for TTR systems is that the tilting trough reflectors expose individual support members to directionally varying gravitational loads. This greatly increases the mechanical demands placed on the support structure, again increasing system cost and complexity.

A second type of trough reflector system, a type revealed in U.S. Pat. No. 4,159,629, avoids the inherent problems associated with TTR systems. That patent disclosed an energy conversion system wherein the rows of trough reflectors do not have a fixed orientation. Instead, all the rows of reflectors rotate in a horizontal plane about a common vertical axis as they track the sun. These non-tilting trough reflectors can be positioned side by side, thus providing efficient utilization of available surface area. Also, as noted in the above mentioned patent, all the reflectors can be moved with a single drive/control mechanism, thus providing significant system simplification. Finally, the non-tilting trough reflectors revealed in U.S. Pat. No. 4,159,629 provide directionally invariant loads to the reflector/receiver support structure.

Energy conversion systems which use non-tilting trough reflectors will be referred to herein as Vertical Axis Trough Reflector (VATR) systems because sun tracking is accomplished by simultaneously rotating all the rows of trough reflectors about a central vertical axis. The present invention is based on the VATR system concept. When the structural framework disclosed herein is coupled with the VATR system concept, the resulting energy conversion system is modular and scalable, and because of its high energy utilization capability, the system is practical even in locations where latitude or weather patterns reduce the total amount of solar energy available in a given year. Most importantly, because the system makes efficient use of available area, it can be deployed in close proximity to population and industrial centers where the energy is used. This latter characteristic is important because the valuable low-grade thermal energy provided by the system cannot be efficiently transported over long distances. It must be used locally. The modularity, scalability, and site adaptability of the presently disclosed system successfully address the third problem mentioned above.

BRIEF SUMMARY OF THE INVENTION

The invention disclosed herein provides improvements and extensions of the VATR system concept which was originally disclosed in U.S. Pat. No. 4,159,629. The improvements and extensions derive primarily from a novel structural framework which accurately maintains the position and alignment of a set of parabolic trough reflectors relative to a corresponding set of receiver assemblies (solar cell arrays and associated cooling channels) as the entire system rotates to track the sun. The structural framework, together with other apparatus revealed herein, provides practical, enabling technology for the VATR system concept and it provides important performance enhancements relative to previously revealed systems that utilize the concept.

The main advantages offered by the VATR system concept are that it provides efficient use of available area, it allows simplified drive and control mechanisms to be used in sun tracking, and it provides directionally invariant gravitational loads to the support structure. However, nearly forty years after the VATR concept was originally disclosed, its inherent advantages have never been fully realized, in large part because of the difficulty of maintaining the very demanding optical alignment requirements of functional components as the system rotates. For example, acceptable performance of a VATR system can only be achieved when the trough reflector surfaces are oriented so that the extended optical plane of each reflector (plane containing the reflector's vertex line and its focal line) bisects the solar disk with an angular accuracy of roughly a tenth of a degree. In previously disclosed VATR systems the task of maintaining this critical optical alignment has been addressed by situating the systems on the surface of a fluid, such as on the surface of a lake or a man-made reservoir (e.g. U.S. Pat. Nos. 4,159,629, 8,056,544, and 8,283,555). Unfortunately, a fluid provides very limited alignment control for an extended system, and that control is only effective when wind velocities are low. Also, the requirement of having a fluid as support for a large system severely limits the number of acceptable deployment locations.

The preferred embodiment of the present invention consists of a VATR solar energy conversion system which operates while situated on a solid surface, such as a land area or the flat roof of a large building. The key element of the system is a structural framework which interconnects the functional system components (trough reflectors, solar cell arrays, and cooling apparatus) and accurately maintains their relative position and alignment over a broad range of environments and operational conditions. An additional advantage of the present system is that the majority of the members comprising the structural framework can be assembled from simple mechanical elements made of lightweight, inexpensive composite materials such as fiberglass or fiber-reinforced plastic.

The main components of the present system are: reflector assemblies, consisting of parabolic trough reflectors and reflector support trusses; receiver assemblies, consisting of cooling channels and planar arrays of solar cells that are held in intimate thermal contact with the cooling channels; wheel assemblies, which provide a rotational capability for the entire system in a horizontal plane; and a structural framework, consisting primarily of three types of trusses which interconnect and support the other system components. The three truss types comprising the structural framework are: main support trusses, which extend along the edges of the parabolic trough reflectors and transfer the weight of the system to the wheel assemblies; reflector support trusses, which support the parabolic trough reflectors and also maintain the shape of the reflector surfaces; and receiver support trusses, which support the receiver assemblies and maintain their position relative to the parabolic trough reflectors. An important feature of the present system is that the design allows some components to perform more than one function. For instance, the cooling channels, which collect thermal energy from the solar cells, also serve as the upper chords of the receiver support trusses. The main support trusses transfer the system's gravitational loads to the wheel assemblies, but they also serve as the lower chords for the receiver support trusses. Simplifications resulting from the use of multi-function components make it possible to practicably comply with the special system design constraints (discussed later) that result from using parabolic trough reflectors in conjunction with planar solar cell arrays. (In the embodiments presented in this application, the system's reflector support trusses are shown as closed web trusses. The main support trusses and the reflector support trusses are shown as simple parallel-chord open trusses. Other truss designs are readily adaptable to the system disclosed herein.)

As a result of developments that have occurred during the past few decades, solar cells offer important advantages when used in solar energy conversion systems. For example, solar cells now have higher efficiencies than solar-driven steam-cycle electrical generating systems (24% efficiency for back-contact single-crystal silicon cells, as opposed to 16% to 18% efficiency for typical solar-powered steam-cycle systems that use trough reflectors). Also, per-kilowatt installation costs for solar cell systems have in some cases fallen below the installation costs for steam-cycle solar energy conversion systems. For these and other reasons, the receiver assemblies of the present system have been designed to use solar cells, even though, as will be explained in more detail later, the use of solar cells in conjunction with parabolic trough reflectors imposes special design constraints on support and alignment structure. The structural framework disclosed herein has design features that circumvent the special optical problems associated with the parabolic trough reflector/solar cell array combination.

In the presently revealed system, active cooling of the solar cells is required. This need for cooling is a positive aspect of the design of the present system because the cooling channels are used as an essential element of the main structural framework. Also, the coolant flowing through the cooling channels collects large quantities of valuable thermal energy and transfers it to a storage medium. The novel structural framework disclosed herein allows the present system to function as an efficient dual-use system and the cooling apparatus is an essential part of the structural framework.

In addition to providing the above mentioned improvements to previously disclosed VATR art, the energy conversion system disclosed herein offers several additional important advances. The nature and extent of these advances will become more apparent after reviewing the drawings, the detailed description of the invention, and the attached claims.

DETAILED DESCRIPTION OF THE INVENTION

Figure 1A:
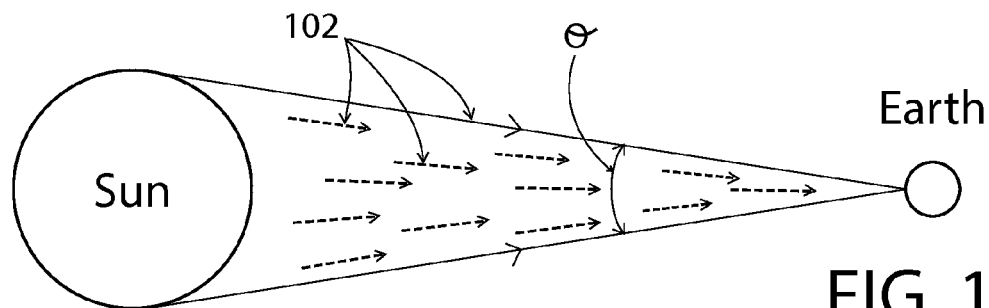
FIG. 1A shows the solar illumination of a point on the surface of the earth as a conical bundle of rays.

A discussion of terminology is presented as a prelude to the detailed description of the invention.

A parabolic trough reflector is characterized by its width, W, its length, L, and its focal length, F. All lateral (crosswise) sections of the reflector surface produce identical parabolas. A parabolic trough reflector has a vertex line which passes through the vertex points of its cross-sectional parabolas and it has a focal line which passes through the focal points of the cross-sectional parabolas. The vertex line and the focal line are parallel and are separated by a distance F. The optical plane of a parabolic trough reflector is the plane containing the reflector's vertex line and its focal line. The longitudinal axis of a parabolic trough reflector is parallel to its vertex and focal lines and the transverse axis is perpendicular the reflector's optical plane. The focal plane of a parabolic trough reflector is the plane which contains the reflector's focal line and is perpendicular to its optical plane. The solar disk is the circular area in the sky from which the sun appears to radiate energy. A parabolic trough reflector is properly aligned to collect and focus solar radiation when its extended optical plane bisects the solar disk. In the present system, each reflector is aligned and oriented so that its optical plane maintains verticality in addition to bisecting the solar disk. (Alignment schemes with non-vertical optical planes are possible but they negate advantages offered by the VATR concept.) Solar radiation collected and focused (redirected) by a parabolic trough reflector forms an elongated planar image of the sun referred to herein as the solar image. If reflected radiation coming from the surface of a parabolic trough reflector impinges upon a planar surface positioned within the reflector focal plane, the solar image formed on the surface is said to be focused. If the planar surface is not in the focal plane, the solar image formed on it is said to be defocused.

The term "solar field" as used herein refers to the volume encompassing all the solar radiation propagating towards a parabolic trough reflector's surface. (Any opaque object located within the solar field will cast a shadow on the reflector surface.) The term "focal volume" as used herein designates the volume encompassing all the reflected solar radiation propagating away from the surface of a parabolic trough reflector towards its focal plane. (Any opaque object located within the focal volume will intercept focused radiation that would otherwise illuminate a portion of the solar image.) The term "rim angle" as used herein designates the angle between a parabolic trough reflector's optical plane and a line drawn perpendicularly from any point on the reflector's focal line to a point on either edge of the reflector surface. The three fundamental optical parameters of any parabolic trough reflector are its width, its focal length, and its rim angle. Only two of these parameters may be independently chosen. That is, if two of the three are given, the third may be calculated.

The defining feature of a parabolic trough reflector is that incident light rays that are parallel to the reflector's optical plane are focused (redirected) onto the reflector's focal line. However, when the sun is shining at a point on the earth's surface, the point is not illuminated by parallel rays. Instead, as shown in FIG. 1A, a point on the earth's surface is illuminated by a conical bundle of solar rays 102. The vertex angle θ of the conical bundle varies slightly during the course of a year due to the earth's elliptical orbit, but a commonly accepted yearly mean value is 0.536 degrees. The solar image, whether focused or defocused, always has a finite width (i.e. it is not a line image) because of the angular spread of incident solar rays.

Figure 1B:
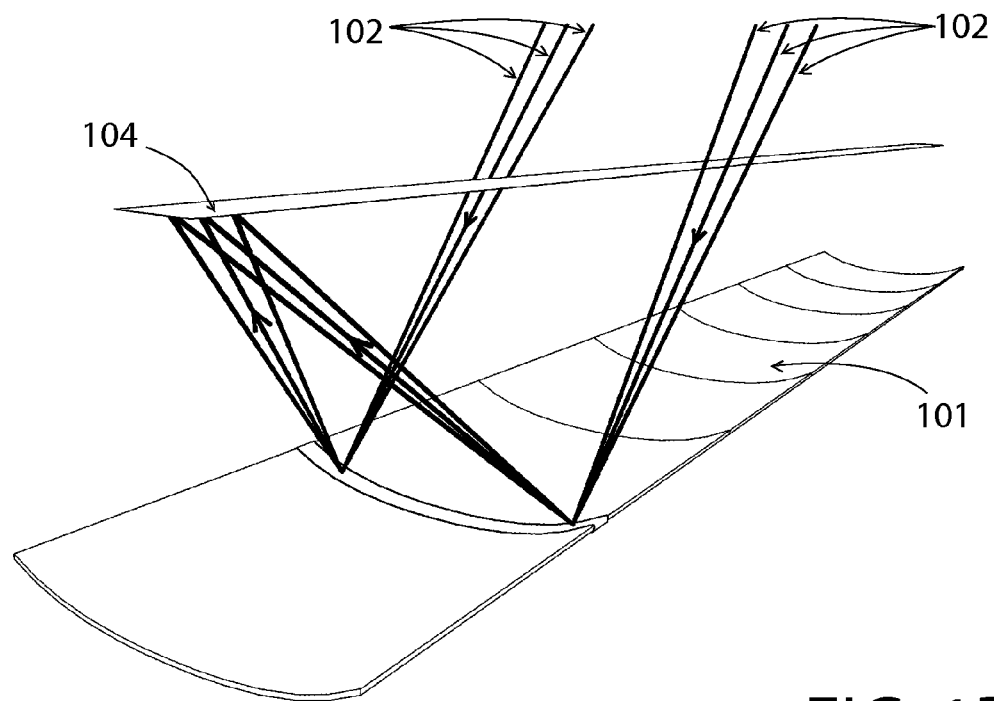
FIG. 1B shows the solar illumination of points on the surface of a parabolic trough reflector and it shows the consequent formation of a planar solar image on an array of solar cells located in the reflector's focal plane.

FIG. 1B shows parabolic trough reflector 101 collecting conical bundles of solar rays 102 to form a solar image on the front surface of planar solar cell array 104. The figure illustrates the general situation wherein the sun is not directly overhead. When the sun is not directly overhead, its angle of elevation produces a longitudinal directional component for both the incident and reflected solar rays.

As shown in FIG. 1B, light rays illuminating an area within the solar image do not come from a single direction or from a single point on the reflector surface; instead, the rays illuminating any particular area within the solar image come from points that are located on a curved band that extends principally in a transverse direction across the reflector width. This fact, and the fact that the sun's elevation angle produces a longitudinal directional component for reflected rays, creates two types of localized shadowing problems that must be avoided in solar-cell-based trough reflector systems.

The first problem is that mechanical structure located within a parabolic trough reflector's focal volume can produce localized shadowing in the solar image plane by intercepting focused radiation. In particular, severe shadowing problems are produced by support structure that extends from the vertex line of the reflector up to its focal line, because structure in that location intercepts strongly focused radiation. This shadowing is a minor problem for solar-thermal energy conversion systems but it is a severe problem for solar-cell-based systems because solar cells are always electrically connected in series or in series/parallel arrays. Localized shadowing of even one cell in an array can proportionately limit the electrical output of a whole chain of cells. This sensitivity to shadowing by structural members within the focal volume leads to the first design constraint of the present system, namely, that there will be no structural member located within the focal volume of any reflector.

The second problem is that, since rays illuminating an area within the solar image come from points that are located transversely across the width of the parabolic trough reflector surface, any structural member or grouping of structural members that is substantially transverse to the direction of the reflector's longitudinal axis will preferentially shadow a transverse band on the reflector surface, thereby preferentially shadowing a certain solar cell or group of cells positioned in or near the focal plane. As mentioned above, preferential shadowing can reduce the performance of a whole chain of cells that is connected to the shaded cell or cells. This leads to the second design constraint of the present system, namely, that no grouping of structural members that is located within the solar field of any parabolic trough reflector (i.e. located so as to intercept rays that would otherwise be incident on the reflector surface) will be positioned perpendicular to, or substantially transverse to, the direction of the reflector's longitudinal axis. For the presently disclosed structural framework, this means that structural members located in the solar field of any parabolic trough reflector will all be oriented so that their primary directional component is parallel to the longitudinal axis of the reflector, thus assuring that only a small portion of the shadow will fall in any particular transverse band on the reflector surface. This eliminates preferential shadowing of any solar cells.

Another important optical consideration for parabolic trough reflector systems is the ratio of reflector focal length to reflector width (F/W). Most parabolic trough reflector systems in use today have relatively small values of F/W, (typically values of 0.3 or less) because small F/W values make it easier to maintain accurate optical alignment of the receiver relative to the reflector. Solar-cell-based systems benefit from high F/W values. There are two reasons for this. First, higher F/W values produce more uniform radiation intensity across the solar image, a situation which enhances the performance of irradiated solar cells. Second, higher F/W values produce lower angles of incidence—and lower reflection losses—for light striking the planar solar cell surfaces. As an example, an F/W value of 0.3 provides angles of incidence of more than 80 degrees (the actual angle of incidence depends on the sun's angle of elevation) for rays passing from the edges of a parabolic trough reflector to solar cells located near its focal plane. Since solar cells are usually covered with a protective layer of glass, Fresnel reflection losses for the "near-edge" rays would be as high as 40% for the first face of the protective glass layer. (Anti-reflection coatings and surface texturing can be used reduce Fresnel reflection losses, but the effectiveness of these techniques is reduced at high incidence angles.) An F/W value of 0.6 produces an angle of incidence of roughly 45 degrees for rays passing from the edges of the reflector to the receiver assembly, with Fresnel reflection losses of only 5% for the first surface of the glass. Thus, consideration of reflection losses indicates that an F/W value in the range of 0.6 or higher would provide significant benefits for solar-cell-based systems with parabolic trough reflectors. However, an F/W of 0.6 provides a theoretical energy concentration ratio of more than 100 near the focal plane, a value which produces such a high heat flux that adequately cooling the solar cells would be problematic. This problem can be alleviated by simply defocusing the system slightly. The defocusing can be accomplished by moving the solar cell arrays down from the focal plane to a location that is closer to the reflector vertex by a few percent of the reflector focal length. Forming a defocused solar image in this way provides a means of selecting a lower energy concentration ratio (such as in the range of 20 to 50 where cooling the solar cells is less of an issue) without significantly affecting the angles of incidence for rays originating near the edges of the reflector. Defocusing has the additional advantage of reducing spatial intensity variations of the radiation impinging on the solar cells arrays.

For any particular solar-cell-based system, the optimum F/W ratio will depend to some degree on the techniques used to manufacture the solar cells and on the latitude at which the system is deployed, but it is clear that systems with trough reflectors and planar solar cell receivers will benefit from F/W ratios that are much higher than are currently used in commercial trough reflector systems. The relatively large values of F/W that are desirable for solar-cell-based systems present challenging alignment and stability issues because the receiver assemblies in these systems are a relatively long distance from the trough reflector vertices. The structural framework disclosed in the present invention assures stable, accurate positioning and alignment of system components, even for F/W ratios in the range of 0.6 or greater.

To summarize, the implications of the above optics discussion are that the performance of solar-cell-based systems with parabolic trough reflectors can be enhanced by implementing a support/alignment structure which; first, has no structural element located within the focal volume of any trough reflector; second, has no structural element or grouping of structural elements positioned so as to preferentially shadow a solar cell or cells located in or near the focal plane of any trough reflector; and third, has a reflector F/W value that is large enough (in the range of 0.6 or larger) that reflection losses are low and adequate cooling can be easily provided. The structural framework disclosed in the present invention meets these three design constraints and offers other important advances for VATR systems.

Figure 2:
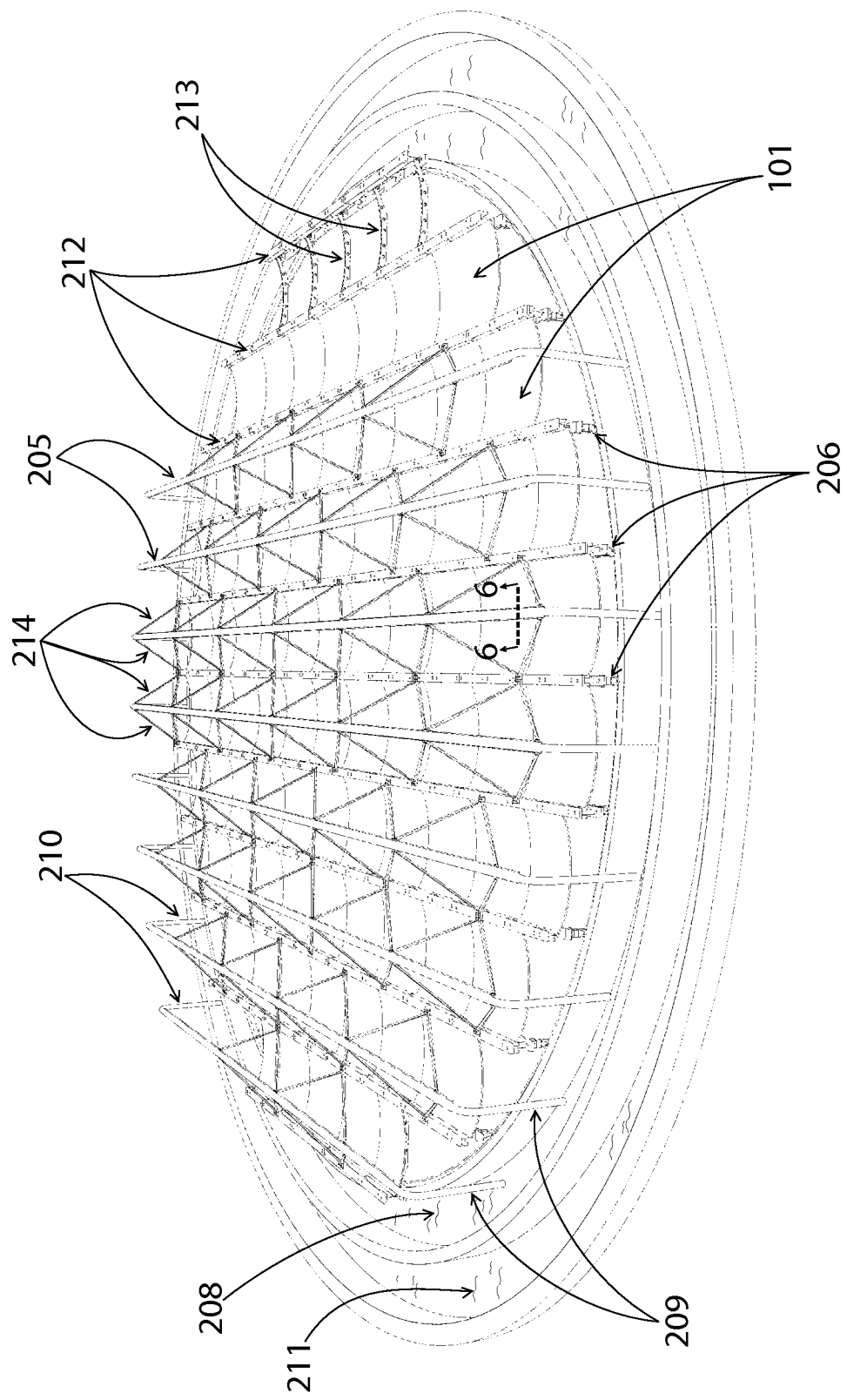
FIG. 2 is a perspective view of the preferred embodiment of the present invention wherein the disclosed solar energy conversion system is situated on a solid surface.

FIG. 2 is a perspective view of the preferred embodiment of the presently disclosed solar energy conversion system. In this embodiment, the system is situated on a solid surface, such as a land area or the flat roof of a large building. For clarity, the system is shown in a partially assembled state so as to expose the lower structural levels on the right hand side of the figure.

The major components of the system shown in FIG. 2 are: a set of parallel rows of parabolic trough reflectors 101, a set of cooling channels 205 aligned in parallel rows corresponding to the rows of parabolic trough reflectors, a set of planar arrays of solar cells (not visible in the view of FIG. 2) held in intimate thermal contact with cooling channels 205, a set of wheel assemblies 206 which provide rotational mobility for the system in a horizontal plane, and a distributed structural framework which interconnects and supports the system components.

The structural framework holds each parabolic trough reflector 101 so that its optical plane is vertical and its associated receiver assembly (cooling channel and attached solar cells) is at the desired distance from the trough reflector's vertex line. During operation, the system rotates about a central vertical axis to track the azimuthal position of the sun. Each parabolic trough reflector 101 focuses solar radiation onto an array of solar cells located in or near its focal plane. The solar cell arrays are mounted to planar walls (the walls facing the parabolic trough reflectors' vertices) of the cooling channels. Coolant flowing within the cooling channels collects the thermal energy produced within the solar cell arrays as it is conducted through the cooling channel walls.

In the embodiment of the present invention shown in FIG. 2, coolant is supplied to the system from coolant intake reservoir 208 which is concentric with the rotating portion of the system, with coolant supply lines 209 carrying the coolant vertically from the coolant intake reservoir to cooling channels 205 (one coolant supply line for each cooling channel). Coolant flows from one end of each cooling channel to the other, where it passes downward through coolant discharge lines 210 and into coolant discharge reservoir 211, which is also concentric with the rotating system. The warm coolant is pumped, or alternatively, moved by gravity, from the coolant discharge reservoir to energy storage reservoirs (not shown). Each coolant supply line has its own individual pump (not shown) which provides the hydraulic head required to move coolant though the associated cooling channel. Since the solar cell arrays and the associated cooling channels are not all of the same length, they are subjected to different thermal loadings. An important advantage of using a separate pump for each cooling line is that each pump can be sized to provide the required flow for its particular channel. Another advantage of this end-to-end embodiment of the coolant supply and discharge lines is that it can be implemented without introducing preferential shadowing of any individual solar cell or group of cells in the receiver assemblies. Also, since the cooling channels in this end-to-end embodiment operate in parallel, one of the receiver assemblies can be shut down for maintenance while the others are aligned and operating with full coolant flow. During a maintenance operation involving a single receiver assembly, the associated parabolic trough reflector can be covered by a light-absorbing blanket in order to prevent overheating of the solar cells in that particular receiver assembly. For clarity, FIG. 2 shows the coolant intake and discharge reservoirs outside the circular periphery of the rotating portion of the system. It should be noted that in actual practice, the system could be designed with the reservoirs beneath the rotating portion of the system in order to reduce the overall area of the system.

Other implementations of the coolant supply and discharge lines are possible, and some, such as variations of center-fed cooling channels, have been proposed previously for thermal systems, (e.g. U.S. Pat. No. 8,056,554) but such implementations are not optimal for solar-cell-based systems because they produce preferential shadowing of solar cells. Also, center-fed cooling systems lack the flexibility of the present system for independently controlling the coolant flow to individual cooling channels.

The structural framework disclosed in the present invention is made up of three truss types that interconnect and support the operative system components. Referring again to FIG. 2, these truss types are: main support trusses 212, reflector support trusses 213, and receiver support trusses 214. Main support trusses 212 are located at the edges of parabolic trough reflectors 101 and extend along the full length of the parabolic trough reflectors. Main support trusses 212 rest on the wheel assemblies 206 and transfer the entire weight of the system to them. The reflector support trusses 213 are spaced at regular intervals (spacing in the range of 0.2 to 1.0 times the reflector width) along the lengths of the parabolic trough reflectors and they extend from one side of the reflectors to the other. They transfer the gravitational loads of the parabolic trough reflectors to main support trusses 212 and they maintain the parabolic shape of the reflector surfaces under gravitational loading. Also, the reflector support trusses link all of the main support trusses into a rigid horizontal framework. The receiver support trusses 214 extend upwards at an angle from the main support trusses 212 to the cooling channels 205. They transfer the weight of the receiver assemblies to the main support trusses 212 and they stabilize the receiver assemblies with respect to both horizontal and vertical movement relative to the trough reflectors. The receiver support trusses 214 may be thought of as simple parallel chord trusses with the upper chords being the cooling channels and the lower chords being the main support trusses. When the system revealed in FIG. 2 is properly aligned, only the receiver assemblies and the diagonal webbing of the receiver support trusses are located in the solar field of the reflectors. These elements produce shadows on the reflector surfaces, but they are located outside of the focal volume of any reflector and they produce no preferential shadowing of any solar cells.

Thus, the location and orientation of the members comprising the structural framework satisfy the structural design constraints discussed above.

FIG. 2 shows the parabolic trough reflector surfaces as continuous across their full width. In another embodiment of this invention, each reflector surface is discontinuous in the region near its vertex. The receiver assembly located above each reflector's vertex shades this region from direct solar radiation. Since the region does not reflect light to the solar cells arrays, it can be used as the location for a concave drainage channel that runs the full length of the reflector. The drainage channels can collect and remove rain water or the cleaning fluids used during maintenance operations.

Figure 3:
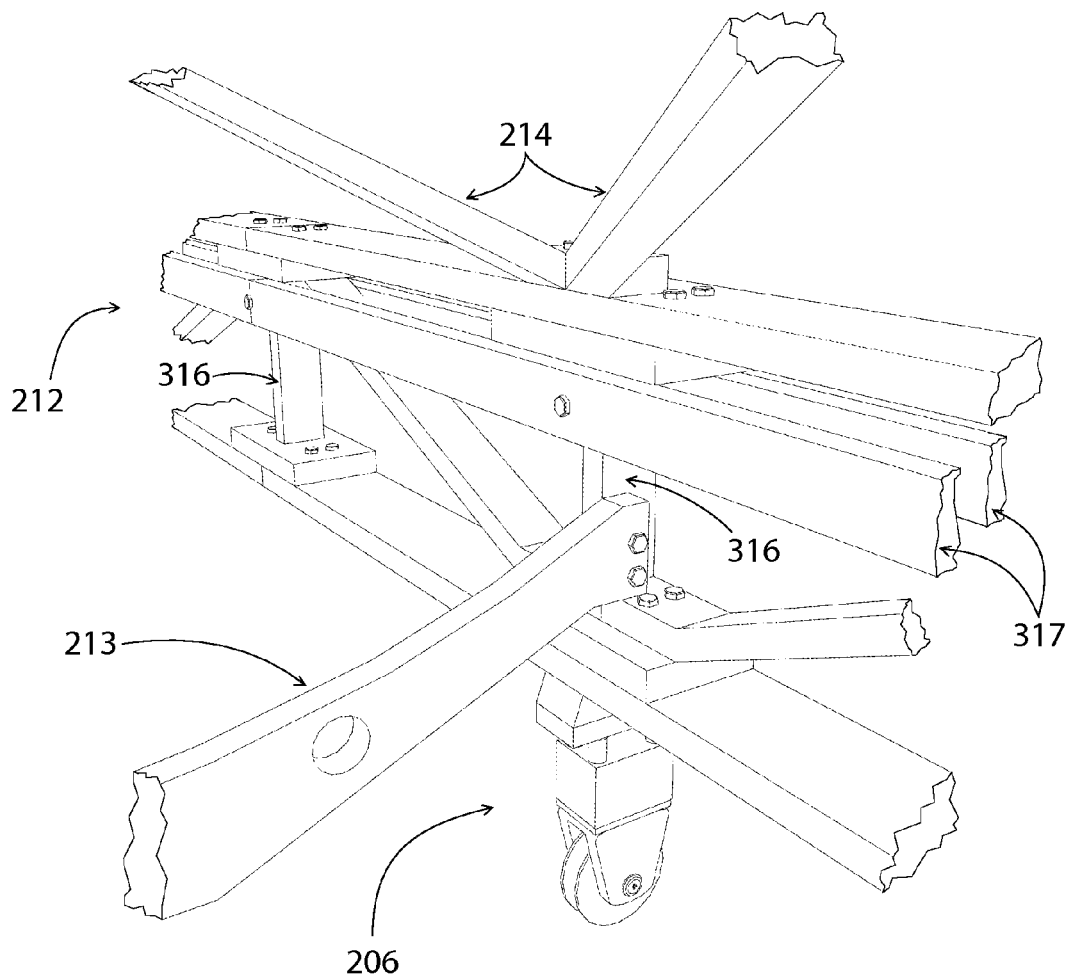
FIG. 3 shows a method of interconnecting the disclosed system's main support trusses with its reflector support trusses and its receiver support trusses.

FIG. 3 shows a method for interconnection of a main support truss 212, a reflector support truss 213, and the webbing of a receiver support truss 214. Main support truss 212 is shown in the figure as a simple parallel chord truss with alternating vertical and diagonal webbing elements, a design which provides long spans with a relatively small amount of webbing material. Vertical webbing members 316 provide attachment areas for reflector support trusses 213. The upper chord of main support truss 212 provides attachment areas for the webbing of receiver support trusses 214. Support rails 317 attached to either side of the vertical webbing members 316 provide support and guidance for a service cart (not shown) that extends across the full width of the parabolic trough reflector. FIG. 3 also shows that the lower chord of main support truss 212 rests on, and is attached to, wheel assembly 206.

Figure 4:
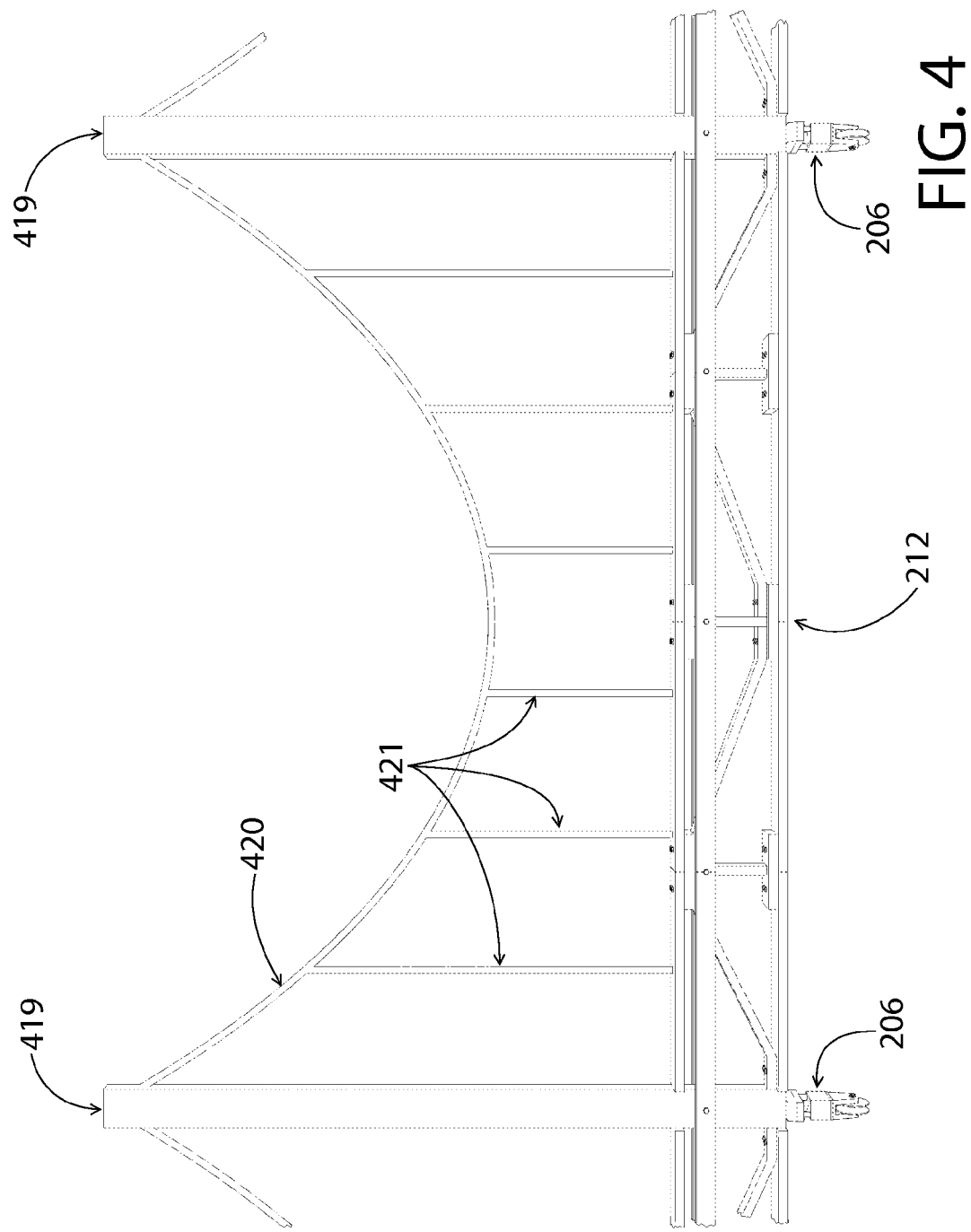
FIG. 4 shows an embodiment of the disclosed system wherein the load-bearing capacity of the main support trusses is enhanced by implementing support towers, a suspension cable, and vertical hanger cables.

FIG. 4 shows an embodiment of the present system wherein the load bearing capacity and achievable span of the main support trusses 212 is enhanced by implementing support towers 419 at locations above the wheel assemblies 206, with the support towers protruding vertically above the structure of the main support trusses. In this embodiment, a suspension cable 420 extends between each pair of support towers, as in a suspension bridge, with vertical hangers 421 dropping from the suspension cable 420 to the main support truss 212. This embodiment converts the bending stresses of the main support trusses into tension stresses in the cables and compression stresses in the support towers. The longer spans provided by the main support trusses in this embodiment decrease the number of wheel assemblies required and the number of concentric circular paths required for the wheels.

Figure 5:
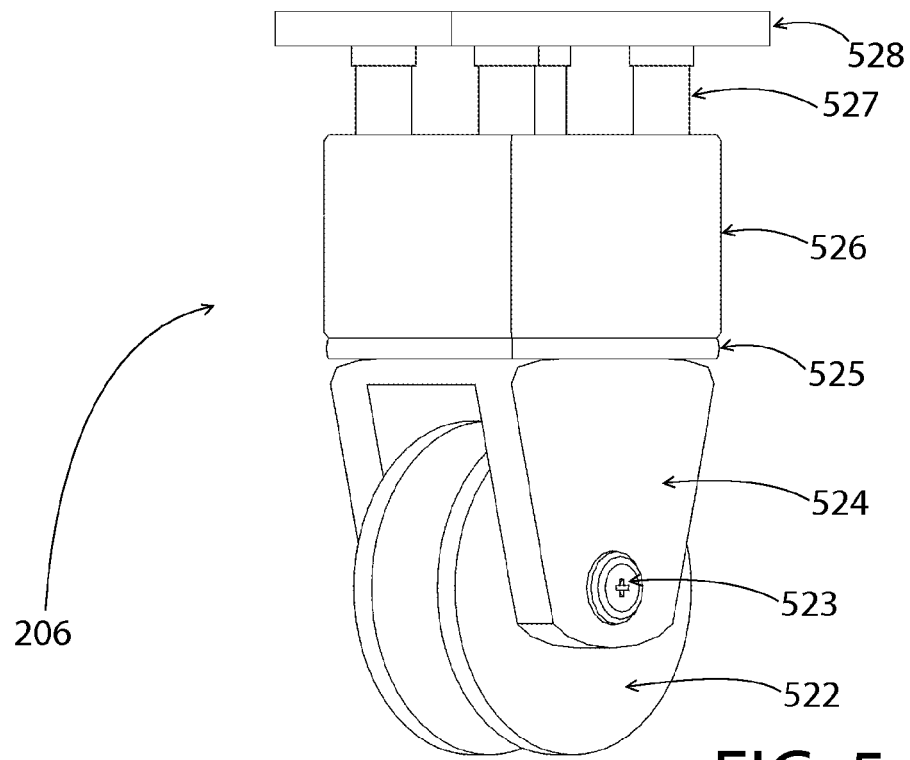
FIG. 5 shows the components of one of the disclosed system's wheel assemblies.

In the preferred embodiment of the present invention, the disclosed system rotates on a solid, flat surface by means of wheel assemblies located under, and attached to, the main support trusses. FIG. 5 is a schematic of a wheel assembly 206. The main components of the wheel assembly are the wheel 522, the axel 523, the wheel bracket 524, the bearing plate assembly 525, the hydraulic drive assembly 526, the hydraulic pistons 527, and the attachment plate 528. The bearing plate assembly 525 allows the wheel to pivot about its vertical axis, thus allowing it to follow a circular path defined by its distance from the center of the system. Attachment plate 528 provides a method of attaching the wheel assembly to a main support truss.

As the system rotates to track the sun, each of the system's hydraulic drive assemblies 526 responds to signals from system level sensors (not shown) by driving vertical hydraulic pistons 527. The system's hydraulic drive assemblies (one for each wheel) work in concert to keep each portion of each main support truss in a horizontal plane as the entire system rotates, in spite of any surface irregularities. This assures that the optical plane of each parabolic trough reflector remains vertical.

The system's wheels may be inflatable (tires) for movement on a circular paved surface, or they may be metal wheels moving on a circular rail structure, or they may be some combination thereof. It is anticipated that the wheels farthest from the system center will be metal wheels moving on rails, thus providing guidance for the system as it rotates and maintaining for the system a true circular movement.

Some or all of the support wheels will be motor driven. The motors (not shown) will force rotation of the system about its central vertical axis. The motors will have two operational modes: a low power sun-tracking mode and a higher power wind-response mode. Since the system rotates very slowly as it tracks the sun, motive power for sun-tracking rotation can be provided by motors operating in a low power mode, with the motors engaged so as to provide high torque to wheels rotating at very low angular velocity. During sun-tracking operation, the motors will be controlled by optical sensors on the main structure, thus assuring that the system constantly maintains its proper orientation relative to the sun's position throughout the course of the day. When wind sensors located near the system indicate that high wind conditions are imminent, the motors driving the system will transition to a higher power mode so as to rapidly rotate the system to an orientation such that the longitudinal axes of the parabolic trough reflector are aligned with the direction of the wind velocity, thus greatly reducing wind-induced stresses on the system and reducing the possibility of damage. Wind response capability is lacking in TTR systems because they have a fixed axis of orientation.

Thermal expansion or contraction of the various members comprising the structural framework will not affect the horizontal location or the orientation of the parabolic trough reflectors relative to the solar cells in the receiver assemblies. As the ambient temperature rises and falls, the solar cells will remain centered vertically above the vertex line of the trough reflectors. Thermal expansion or contraction of the reflector support trusses will not significantly affect the focal length or the parabolic shape of the parabolic trough reflectors. Thermal expansion or contraction of the webbing in the receiver support trusses will raise or lower the receiver assemblies slightly relative to trough reflector vertices, but the size of the solar image is relatively insensitive to this vertical movement and any thermally induced displacement of the solar cells relative to the focal plane will not significantly affect the performance of the system.

It is anticipated that the design of the parabolic trough reflectors used in the present system will benefit from advances made in reflector technology during past decades. These advances relate to the development of rugged, lightweight, highly reflective surfaces that can be accurately manufactured and assembled into the required shapes. On the other hand, the reflector support trusses in the present system are a significant departure from reflector support structures currently in use. The reflector support trusses of the present system are designed to support a constant vertical load that is always in a direction perpendicular to the reflector vertex. They will be held in a fixed horizontal position while being supported by the main support trusses at the reflector edges. They will not require the torque tubes or other bearing structure required by TTR systems. These factors simplify the design of the present system's reflector support trusses and enable wider reflector designs with greatly reduced weight and lower cost.

Figure 6:
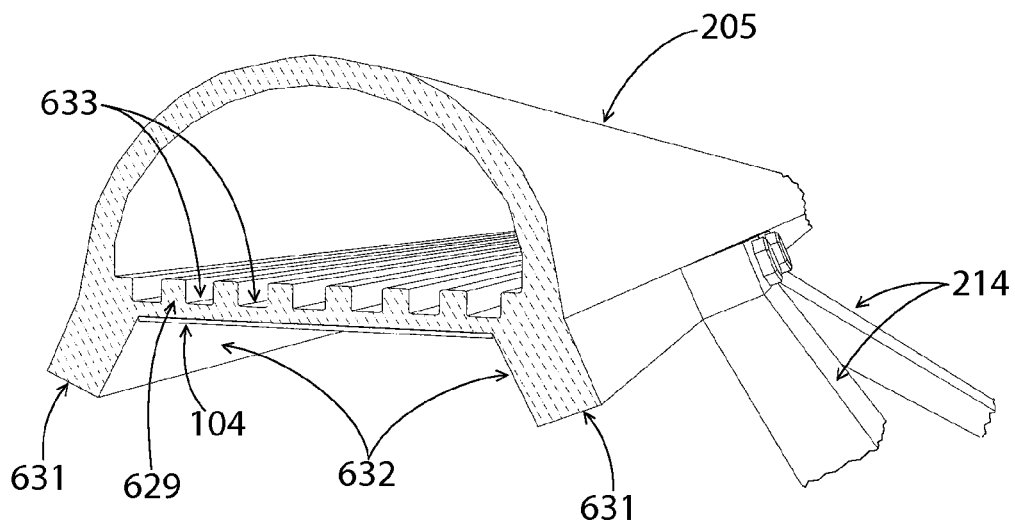
FIG. 6 shows cross sectional details of a cooling channel and a method of attaching the webbing of the receiver support trusses to the cooling channels.

In the presently disclosed system, the cooling channels are an integral part of the structural framework which defines and stabilizes the position and alignment of functional system components. As such, the cooling channels are required to withstand, without significant bending, vertical loads associated with their own weight and horizontal loads produced by the wind. In a preferred embodiment, the cooling channels will be made of a thermally conductive, light-weight metal alloy, such as an aluminum alloy, with the solar cell arrays mounted directly to the planar walls of the cooling channels. Plastic or composite material may also be used in fabricating the cooling channels, in which case a metal plate (with solar cells attached) would be installed as one wall of the cooling channels. FIG. 6 (section 6-6 of FIG. 2) shows the cross sectional details of a metal cooling channel 205 and it shows a method of attachment for the webbing of the receiver support trusses 214. This embodiment of cooling channel 205 has two external fins 631 positioned symmetrically on either side of the planar wall 629 of the cooling channel. The fins 631 provide resistance to bending caused by both vertical and horizontal forces and they provide attachment surfaces for the diagonal webbing of the receiver support truss 214. (Cooling channels serve as the upper chords of the system's receiver support trusses.) With the fins 631 located on either side of the solar cells array 104, and with the cooling channels 205 located above them, the solar cell array is completely shielded from bird droppings, dust, rain, hail, and wind-born debris.

In a further embodiment of the present system, also illustrated in FIG. 6, the fins 631 of cooling channel 205 have a reflective coating 632 on the faces nearest the solar cells array, with said reflective coating being highly reflective of solar radiation. In addition, the fins 631 will be set at an angle of 45 degrees or less with respect to vertical so as to gather and redirect to the solar cell array stray light coming from the reflectors. This latter embodiment is effective for F/W ratios of 0.6 or greater, where the rim angle of the reflectors is less than 45 degrees. In a further embodiment of the system, the common width of planar wall 629 and its associated solar cell array 104 is less than the width of the solar image at the location of the planar wall, thus positioning fins 631 so that their reflective surfaces can intercept and redirect light at the edges of the solar image, thereby reducing the spatial intensity variations of solar radiation incident on solar cell array 104. Regarding these last two points, it is well known that the radiation intensity of a solar image formed by a parabolic trough reflector is very non-uniform, having higher intensity at its center than at its edges. (This problem becomes more severe with lower F/W values.) Optimal performance of solar cells is achieved with uniform irradiation. By designing the system in such a way that the solar image formed on the solar cells is defocused, and by designing the system in such a way that the highly reflective surfaces of the cooling channel fins redirect (to the solar cells) light near the edges of the solar image, a more uniform optical intensity is achieved in the plane of the solar cells. (Redirection of light rays by plane surfaces set at acute angles relative to each other is a common non-imaging optical technique called optical funneling.) It should also be noted that defocusing the system and using the fins to accomplish optical funneling not only improves the spatial uniformity of the solar image, but it also make the system less sensitive to angular misalignment.

FIG. 6 shows that the inside of the planar wall of the cooling channel has a set of longitudinal grooves 633 that run the length of the cooling channel. The purpose of the grooves is to provide additional contact area between the channel wall and the cooling fluid. This technique, which is commonly used in high-performance heat exchangers, significantly decreases the thermal impedance—and the temperature difference—between the solar cells and the cooling fluid.

The previous paragraphs have discussed embodiments of the present invention wherein solar cells are installed along the entire length of the cooling channels. In these embodiments, the flow rates in the cooling channels are controlled so that some nominal maximum temperature of the coolant (and therefore of the solar cells) is not exceeded at the channel outlets. However, it may be desirable to deliver the system's low-grade thermal energy to a storage medium at temperatures higher than the maximum desired for the solar cells. This eventuality may be realized by an embodiment of the present system wherein solar cells are only installed along a portion of the cooling channel length, with a radiation absorbent coating along the rest of the length. It is then possible to keep the temperature of the solar cells below the desired maximum while at the same time delivering the coolant to the energy storage reservoir at some desired higher temperature.

In summary, this application does not seek rights of patent protection for the concept of a VATR system, or for a VATR system that uses trough reflectors to focus solar energy onto solar cell arrays, or for a dual-use system that provides both electricity and thermal energy. Instead, the present application seeks patent protection for a system characterized by a specific arrangement and interconnection of structural and functional elements, with said elements having particular features and responding to specific control techniques. The system thus disclosed provides enabling technology which allows the inherent advantages of the VATR concept to be realized in the form of a practical, dual-use solar energy conversion system which makes optimal use of incident solar radiation.

What is claimed is:

1. A solar energy conversion system comprising the following:
   a) a multiplicity of parabolic trough reflector assemblies aligned in parallel rows, with each of said parabolic trough reflector assemblies including a parabolic trough reflector which is highly reflective of solar radiation
   b) a multiplicity of receiver assemblies aligned in parallel rows in one-to-one correspondence with the aforementioned rows of parabolic trough reflector assemblies, with each of said receiver assemblies including
      i) a cooling channel wherein flows a coolant capable of absorbing thermal energy from the cooling channel walls, with said cooling channel having one planar wall extending along its full length, and with said cooling channel positioned and oriented so that its planar wall is perpendicular to, and bisected by, the optical plane of its associated parabolic trough reflector, and
      ii) a planar array of solar cells extending along the length of the planar wall of the aforementioned cooling channel, with said planar array of solar cells maintained in intimate thermal contact with the planar wall of its associated cooling channel, and with the width of said solar cell array being substantially equal to the width of the planar wall of its associated cooling channel;
   c) a multiplicity of coolant supply lines, one of which is attached to each of the aforementioned cooling channels, and with each of said coolant supply lines equipped with a variable speed pump capable of providing a flow of coolant through its associated cooling channel;

d) a coolant supply reservoir which is spatially disposed at the periphery of the aforementioned system in such a manner that the coolant in said coolant supply reservoir is continuously available to each of the aforementioned coolant supply lines, regardless of the angular orientation of said system;

e) a multiplicity of coolant discharge lines, one of which is attached to each of the aforementioned cooling channels;

f) a coolant discharge reservoir which is spatially disposed at the periphery of the aforementioned system in such a manner that heated coolant which is discharged by the said coolant discharge lines flows freely and directly into said coolant discharge reservoir, regardless of the angular orientation of said system;

g) a structural framework including
  i) main support trusses, with said main support trusses located at the edges of the aforementioned parabolic trough reflector assemblies and extending the full length of said parabolic trough reflector assemblies in a direction parallel to their longitudinal axes, and
  ii) parabolic trough reflector support trusses, with said parabolic trough reflector support trusses located at regular intervals along the length of the aforementioned parabolic trough reflectors, and with said parabolic trough reflector support trusses attached to the aforementioned main support trusses, thereby transferring the gravitational loads of said parabolic trough reflector assemblies to said main support trusses, and
  iii) receiver assembly support structure which supports individual receiver assemblies, with said receiver assembly support structure consisting of diagonal support members connected between attach points on said receiver assembly's cooling channel and attach points on the two main support trusses that extend along the longitudinal edges of said receiver assembly's associated parabolic trough reflector;

h) a set of wheel assemblies attached to the aforementioned main support trusses, with said wheel assemblies providing support for the system and mobility for the system in a horizontal plane;

i) a motive mechanism provided to one or more of the aforementioned wheel assemblies, with said motive mechanism providing a capability for forcing rotation of the system in a horizontal plane about a central vertical axis.

2. A system as described in claim 1 wherein all structural members comprising the aforementioned structural framework are external to the focal volume of any parabolic trough reflector.

3. A system as described in claim 1 wherein all structural members located in the solar field of any parabolic trough reflector are oriented such that their major directional components are parallel to the longitudinal axis of said parabolic trough reflector.

4. A system as described in claim 1 wherein the motive mechanism provided to the aforementioned wheel assemblies has two operational modes, namely, a low-power sun-tracking mode wherein the motive mechanism is capable of rotating the system at rates in the range from 0.2 to 0.3 degrees per minute, and a high-power, wind-response mode wherein the motive mechanism is capable of rotating the system at rates in the range from 15 to 20 degrees per minute.

5. A system as described in claim 4 wherein the motive mechanism responsible for rotating the system is controlled by signals generated by optical sensors located on the system and by wind sensors located remotely from the system.

6. A system as described in claim 1 wherein each wheel assembly is equipped with a vertical pneumatic drive mechanism which acts upon its associated main support truss in response to signals from level sensors on the system, with all of said pneumatic drive mechanisms acting in concert to maintain vertical orientation of each parabolic trough reflector's optical plane, in spite of irregularities in the surface over which the system rotates.

7. A system as described in claim 1 wherein the coolant flow through each individual cooling channel is independently controlled by an associated variable speed pump, and with each variable speed pump controlled by signals from temperature sensors located along the length of said cooling channel.

8. A system as described in claim 7 wherein the coolant is recycled after passing through the multiplicity of cooling channels, with the recycling accomplished by transferring the warm coolant to an energy storage reservoir, either directly, or indirectly as through a heat exchanger, and then returning the coolant to the cooling channels, either directly, or indirectly as through a heat exchanger.

9. A system as described in claim 1 wherein each solar cell array consists of one or more parallel rows of solar cells that are electrically connected in series, and with said rows of series-connected solar cells extending in a direction parallel to the longitudinal axis of the associated cooling channel.

10. A system as described in claim 1 wherein, for each receiver assembly, the solar cell array is set at a fixed distance from the vertex of the associated parabolic trough reflector, with the fixed distance being in the range from 0.9 to 1.0 times the focal length of said parabolic trough reflector.

11. A system as described in claim 1 wherein each cooling channel has two external fins extending along its full length, with said fins located adjacent to, and on opposite sides of, the planar wall of said cooling channel.

12. A system as described in claim 11 wherein, for each parabolic trough reflector, the ratio of the parabolic trough reflector's focal length to its width is 0.6 or greater and, for each cooling channel, the external fins have coatings that are highly reflective of solar radiation on the surfaces adjacent to the planar wall of said cooling channel, and with said external fins extending downward at an angle relative to vertical which is equal to the rim angle of the associated parabolic trough reflector.

13. A system as described in claim 12 wherein, for each receiver assembly, the common width of the planar wall of the cooling channel and the attached solar cell array is 5% to 25% less than the width of the solar image at the location of said planar wall, thus positioning the highly reflective surfaces of the aforementioned external fins so as to redirect light at the edges of the solar image onto the arrays of solar cells.

14. A system as described in claim 1 wherein the full length and width of the internal surface of the planar wall of each cooling channel has longitudinal grooves of sufficient depth and width that the internal surface area of said planar wall is 2 to 2.75 times as great as the flat external surface area of said planar wall.

15. A system as described in claim 1 wherein the parabolic surface of each parabolic trough reflector is discontinuous in the region near its vertex which is shaded from direct sunlight by the associated receiver assembly, with said shaded region depressed in elevation relative to the parabolic surface of the reflector so as to provide a concave drainage conduit for rainwater and cleaning fluids, and with said depressed region extending the full length of said parabolic trough reflector.

16. A system as described in claim 1 wherein a horizontal support rail is attached to each face of each main support truss, and with each of said horizontal support rails extending the full length of its associated main support truss, and with all of the system's horizontal support rails located in the same horizontal plane, so as to provide the capability for supporting and guiding a service cart that is the full width of the aforementioned parabolic trough reflectors.

17. A system as described in claim 1 wherein, for each main support truss, vertical support towers are set above each of the attached wheel assemblies, with said support towers rising in elevation above said main support trusses, and with a suspension cable extending between each adjacent pair of support towers along the lengths of said main support trusses, and with vertical cables (hangers) connecting each of said suspension cables to the associated main support truss.

* * * * *